United States Patent
Hoffmann et al.

(10) Patent No.: US 7,031,218 B2
(45) Date of Patent: Apr. 18, 2006

(54) EXTERNALLY CLOCKED ELECTRICAL FUSE PROGRAMMING WITH ASYNCHRONOUS FUSE SELECTION

(75) Inventors: Jochen Hoffmann, Colchester, VT (US); Wolfgang Hokenmaier, Burlington, VT (US)

(73) Assignee: Infineon Technologies AG, Munich (DE)

(*) Notice: Subject to any disclaimer, the term of this patent is extended or adjusted under 35 U.S.C. 154(b) by 171 days.

(21) Appl. No.: 10/717,178

(22) Filed: Nov. 17, 2003

(65) Prior Publication Data

US 2004/0156226 A1 Aug. 12, 2004

Related U.S. Application Data

(60) Provisional application No. 60/427,207, filed on Nov. 18, 2002.

(51) Int. Cl.
*G11C 7/00* (2006.01)
*G11C 8/00* (2006.01)

(52) U.S. Cl. .............. 365/225.7; 365/96; 365/230.08; 365/233; 365/239

(58) Field of Classification Search ........... 365/189.05, 365/189.12, 200, 225.7, 96, 230.08, 239
See application file for complete search history.

(56) References Cited

U.S. PATENT DOCUMENTS

| | | | | |
|---|---|---|---|---|
| 4,630,240 | A * | 12/1986 | Poteet et al. | 365/189.05 |
| 5,960,405 | A * | 9/1999 | Trefethan et al. | 705/9 |
| 6,426,911 | B1 * | 7/2002 | Lehmann et al. | 365/225.7 |
| 6,433,714 | B1 * | 8/2002 | Clapp et al. | 341/121 |
| 6,542,419 | B1 * | 4/2003 | Hasegawa | 365/200 |
| 6,600,686 | B1 * | 7/2003 | Huh et al. | 365/201 |
| 6,690,193 | B1 * | 2/2004 | Heinzer et al. | 326/37 |
| 6,694,492 | B1 * | 2/2004 | Shakkarwar | 716/2 |
| 6,809,975 | B1 * | 10/2004 | Yamaoka et al. | 365/201 |
| 2002/0021590 | A1 * | 2/2002 | Lammers et al. | 365/189.12 |
| 2002/0105452 | A1 * | 8/2002 | Clapp et al. | 341/144 |
| 2003/0226078 | A1 * | 12/2003 | Meaney et al. | 714/726 |
| 2004/0151276 | A1 | 8/2004 | Hoffmann | |

* cited by examiner

*Primary Examiner*—Huan Hoang
*Assistant Examiner*—Ly Duy Pham
(74) *Attorney, Agent, or Firm*—Patterson & Sheridan, L.L.P.

(57) ABSTRACT

Embodiments are provided in which a method and an apparatus for sequentially programming electrical fuses are described. A fuse pointer is advanced to point to (i.e., select) the fuses sequentially. When the fuse pointer reaches (i.e., points to) a fuse that is not to be blown, the fuse pointer automatically and asynchronously (e.g. not synchronized to a programming clock signal) skips the fuse. On the other hand, when the fuse pointer reaches a fuse that is to be blown, the fuse pointer stops and the fuse is blown synchronously (e.g., in response to the programming clock signal). After the blow, the fuse pointer advances to the next fuse and the process described above repeats, until the last fuse is programmed. A fuse latch circuit associated with the blown fuse may be optionally reset prior to advancing the fuse pointer.

34 Claims, 7 Drawing Sheets

T1 : BLOW MODE TIME
T2 : FUSE LATCH RESET MODE TIME
T3 : POINTER ADVANCE MODE TIME

T1 : BLOW MODE TIME
T2 : FUSE LATCH RESET MODE TIME
T3 : POINTER ADVANCE MODE TIME

EXTERNALLY CLOCKED ELECTRICAL FUSE PROGRAMMING WITH ASYNCHRONOUS FUSE SELECTION

CROSS-REFERENCE TO RELATED APPLICATIONS

This application claims priority to U.S. provisional patent application Ser. No. 60/427,207, filed Nov. 18, 2002, and is related to the commonly-owned, U.S. patent application Ser. No. 10/716,381 entitled DUAL-PURPOSE SHIFT REGISTER, filed herewith, both of which are herein incorporated by reference in their entirety.

BACKGROUND OF THE INVENTION

1. Field of the Invention

The present invention generally relates to the programming of fuses, and more particularly to sequential programming of electrical fuses.

2. Description of the Related Art

Electrical fuses are commonly used on integrated circuits (ICs) for the programming of manufacturer settings. For example, common uses are the enabling of redundancy on memory ICs, the trimming of certain parameters to compensate for process variations, and the customization of the IC's external specification and behavior. Typically, an electrical fuse is comprised of either a narrow conducting wire or a thin insulating layer between two conducting layers. Information (one bit) is stored (programmed) in the electrical fuse by either leaving the electrical fuse intact or blowing the electrical fuse to change its resistance beyond a certain threshold.

If the electrical fuse is of the first type (i.e., including a narrow conducting wire), changing its resistance beyond a certain threshold can be achieved by forcing a large enough current through the fuse, causing the narrow conducting wire to disintegrate (i.e., blowing the fuse) and thus increasing its resistance by several orders of magnitude. If the electrical fuse is of the second type (i.e., including a thin insulating layer between two conducting layers), the electrical fuse is initially of high resistance. Changing its resistance beyond a certain threshold can be achieved by applying a large enough voltage across the insulating layer causing a breakdown of this layer (i.e., blowing the fuse). This causes the initial resistance to decrease by several orders of magnitude.

Information stored in an electrical fuse can be read out by opening a current path from a supply voltage across the fuse to a latch. A switching point of the latch is typically chosen to be somewhere between the average resistances of an intact fuse and that of a blown one. As a result, the latch flips in different directions when connected to blown and intact fuses, effectively digitizing the two analog values of the resistance. The readout of a fuse happens at a voltage level that is significantly lower compared to the voltage applied when blowing the fuse (commonly referred to as the blow voltage). This is necessary in order to ensure that repeated read-outs do not damage the fuse.

The success rate for the blowing of fuses correlates strongly to the blow voltage that is applied across the fuse as well as the time window during which the blow voltage is applied. The requirement for a well defined blow voltage makes it difficult to blow fuses in parallel. Both types of fuses, as described above, change their resistance significantly during blowing. If one tries to blow several fuses in parallel, the first fuse to actually blow changes the amount of current it draws and therefore also changes the voltage that is applied across the other fuses that are subjected to the blow voltage at the same time. This means that each fuse that actually blows changes the conditions to which the other fuses are subjected, which make it very difficult to control the blow process. Therefore it is generally preferable to blow fuses in a serial fashion (one fuse at a time).

However, test time and costs become an issue when fuses are to be blown serially. This is especially true for Dynamic Random Access Memories (DRAMs) which employ only electrical fuses. For example, the circuitry used to enable redundancy on a DRAM might contain as many as 2,000 to 20,000 fuses. In reality, on most DRAM chips, only a small percentage of these fuses will actually be blown. The reason is that even if all redundant memory elements (a memory element may comprise a number of memory cells) are used to replace defective normal memory elements, statistically only half the fuses will be blown. Moreover, it is very unlikely that every single redundant memory element is needed for replacing defective normal memory elements. As a result, for a technology that has reached a production-stage, it is typically valid to assume that less than 10 percent of the fuses on an average DRAM will be blown.

The time needed to reliably blow a fuse is strongly dependent on the type of the fuse, the applied blow voltage, and a wide range of technology parameters. Generally, the blow time for a fuse is in the microsecond to millisecond range. Accordingly, because a DRAM may contain thousands of fuses, serial fuse programming may add significant time to the length of a test flow.

There are two widely used methods of addressing (i.e., selecting) fuses for blowing. The first method employs an address decoder to individually address fuses of a memory chip. Therefore, each of the fuses must be assigned a unique address. However, adding an address decoder just for addressing the fuses is generally cost prohibitive because such a decoder with associated address wiring consumes chip area. As a result, this method is viable only if there are address decoders in other circuits of the chip that can be reused for the addressing of the fuses.

The second method employs a pointer shift register of N bits, N fuse latches in series, and N blow circuits in order to program (i.e., blow or leave intact) N fuses. Each of the N fuses corresponds to a bit of the pointer shift register and has a fuse latch and a blow circuit associated with it. The programming data for the N fuses (e.g., a string of 1s and 0s) is shifted into the N fuse latches. Then, a pointer value is shifted sequentially through the N bits of the pointer shift register, one bit for each clock pulse (called a program cycle). When the pointer is at a bit of the shift register, the corresponding fuse is selected (i.e., pointed to by the pointer). For example, in one implementation, all N bits of the pointer shift register initially contain 1s. Then, a 0 (i.e., the pointer) is shifted sequentially through the bits of the pointer shift register to select fuses.

During a program cycle, a fuse is selected and is programmed (blown or not blown) depending on the content of its associated fuse latch. For example, if the associated fuse latch contains a 0, the associated blow circuit is not enabled and the selected fuse is left intact. If the associated fuse latch contains a 1, the associated blow circuit is enabled and a blow voltage is applied across the selected fuse so as to blow the fuse. During the next programming cycle, the next fuse is selected and is programmed (blown or not blown) depending on the content of its associated fuse latch, and so on. One problem of this second method is that programming cycles during which no fuse is blown (called empty programming cycles) waste time. Moreover, because a large percentage of the fuses of a chip do not need to be blown, most of the programming time is wasted on empty programming cycles, which is undesirable.

Accordingly, there is a need for an apparatus and method for the programming of the fuses, which overcomes shortcomings existing in the prior art.

SUMMARY OF THE INVENTION

One embodiment of the present invention provides a fuse programming circuit for sequentially programming a plurality of fuses is described. The fuse programming circuit generally includes a plurality of fuse latch circuits for holding fuse programming data indicating which of the fuses are to be blown, a fuse pointer circuit for selecting fuses configured to asynchronously advance past fuses that are not to be programmed to select fuses that are to be programmed, as indicated by the fuse programming data, and a blow circuit configured to apply a blow voltage to a fuse selected by the fuse pointer circuit if the fuse programming data indicates the selected fuse is to be blown, wherein the application of the blow voltage to the fuse is synchronized with a blow clock signal.

One embodiment of the present invention provides a DRAM. The DRAM generally includes a plurality of fuses, a plurality of fuse latch circuits for holding fuse programming data and a fuse pointer circuit for selecting fuses. The fuse pointer circuit is generally configured to asynchronously advance past fuses that are not to be programmed to select fuses that are to be programmed, as indicated by the fuse programming data. The DRAM also includes a blow circuit configured to apply a blow voltage to a fuse selected by the fuse pointer circuit if the fuse programming data indicates the selected fuse is to be blown, wherein the application of the blow voltage to the fuse is synchronized with a blow clock signal.

One embodiment of the present invention provides a method for sequentially programming a plurality of fuses. The method generally includes loading a plurality of fuse latch circuits with fuse programming data, initializing a fuse pointer to select a first fuse, advancing the fuse pointer to select a second fuse to be blown, as indicated by the fuse programming data, wherein the advancing is not synchronized with a fuse blowing clock signal, and blowing the second fuse, wherein the blowing is synchronized with the fuse blowing clock signal. The method may also include generating the fuse blowing clock signal and an advance pointer clock signal, for controlling the pointer advancement, from an external clock signal.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are, therefore, not to be considered limiting of its scope, for the invention may admit to other equally effective embodiments.

DETAILED DESCRIPTION OF THE PREFERRED EMBODIMENTS

Embodiments are provided in which a method and an apparatus for the programming of fuses are described. A fuse pointer is advanced to point to (i.e., select) the fuses sequentially. When the fuse pointer reaches (i.e., points to) a fuse that is not to be blown, the fuse pointer automatically and asynchronously (e.g. not synchronized to a programming clock signal) skips the fuse. On the other hand, when the fuse pointer reaches a fuse that is to be blown, the fuse pointer stops and the fuse is blown synchronously (e.g., synchronized to the programming clock signal). After blowing the fuse, the fuse pointer advances to the next fuse and the process described above repeats, until the last fuse is programmed. The programming (or blow) clock signal may be generated from an external clock signal, which may be easily varied to ensure adequate exposure time to the blow voltage. By controlling the exposure time with an external clock signal, relatively long exposure times may be achieved without the need for individual delay circuits, thereby, reducing circuitry.

Because the fuse pointer skips consecutive fuses that are not to be blown independently of the programming clock signal, the fuse pointer may skip multiple fuses that are not to be blown and still reach the next fuse that is to be blown prior to arrival of the next programming clock cycle. As a result, the next fuse to be blown may be blown in the next programming clock cycle and therefore the occurrence of "empty" programming cycles may be reduced or eliminated. Embodiments of the present invention may be used to reduce fuse programming time for any type of integrated circuit that has a plurality of electrically programmable fuses, such as a DRAM.

Figure 1:
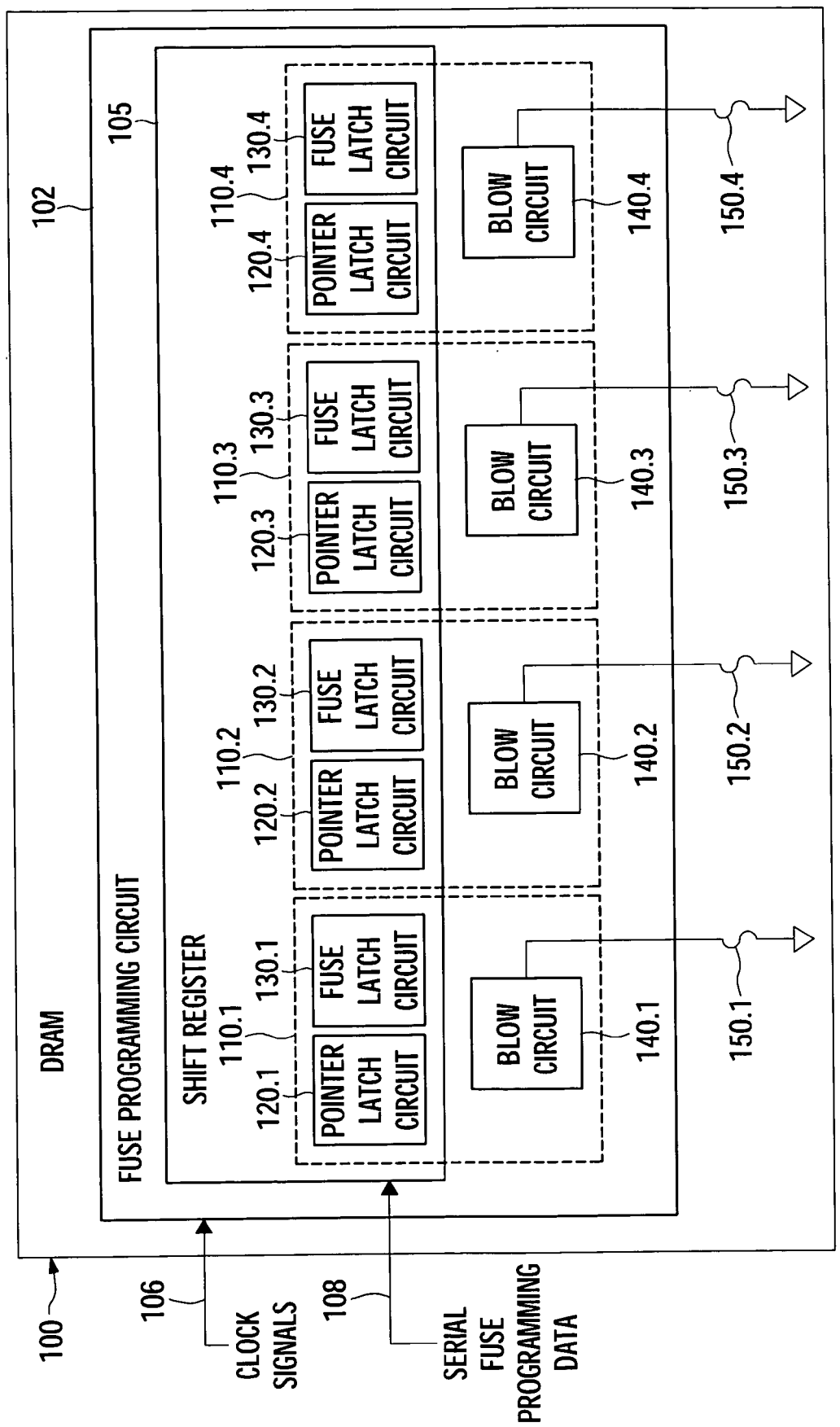
FIG. 1 illustrates a DRAM having a fuse programming circuit according to one embodiment of the present invention.

For example, FIG. 1 illustrates a DRAM 100, according to one embodiment of the present invention, comprising a plurality of fuses 150 (illustratively, four fuses 150.1, 150.2, 150.3, and 150.4) and a fuse programming circuit 102. The fuse programming circuit 102 comprises a plurality of blow circuits 140 (140.1, 140.2, 140.3, and 140.4) for blowing the fuses 150 and a dual-purpose shift register 105 for controlling the blow circuits 140. The dual purposes of the dual purpose shift register 105 may include storing fuse programming data and pointing to the current fuse for blowing. For example, the dual-purpose shift register 105 may include pointer latch circuits 120 and fuse latch circuits 130. The fuse latch circuits 130 may collectively hold fuse programming data identifying which fuses 150 are to be blown. For example, a 1 in a fuse latch circuit 130.i may indicate an associated fuse 150.i is to be blown, while a 0 in the fuse latch circuit 130.i may indicate the associated fuse 150.i is not to be blown. The fuse programming data may be loaded into the fuse latch circuits 130 via one or more serial fuse programming data lines 108.

The pointer latch circuits 120 may collectively hold a pointer value of a fuse pointer which selects (i.e., points to), based on the pointer value, one of the fuses 150. In general, the pointer latch circuits 120 may be configured to automatically and asynchronously skip any fuse 150 that does not need to be blown, as indicated by fuse programming data stored in an associated fuse latch circuit 130. For example, if a fuse 150.i is currently selected by the fuse pointer, and if the associated fuse latch circuit 130.i contains a 0 (which may indicate that the fuse 150.i is not to be blown), then the fuse pointer may automatically and asynchronously advances to select the next fuse 150.i+1. The fuse pointer may continue to automatically and asynchronously advance until the next fuse 150 to be blown is reached, as indicated by data in an associated fuse latch circuit 130.

An Exemplary Fuse Programming Sequence

In some embodiments, a fuse programming sequence may be thought of as comprising three distinct modes: a blow mode, a fuse latch reset mode, and a pointer advance mode. In the blow mode, if a fuse 150.i is currently selected by the fuse pointer and if the associated fuse latch circuit 130.i indicates the fuse 150.i is to be programmed, the blow circuit 140.i applies a blow voltage Vblow across the fuse 150.i so as to blow the fuse 150.i. Subsequent to blowing, the fuse latch circuit 130.i may be optionally reset during the fuse latch reset mode prior to asynchronously advancing the fuse pointer during the pointer advance mode. As will be described in further detail below, the fuse programming modes may be defined by clock signals 106.

Figure 2:
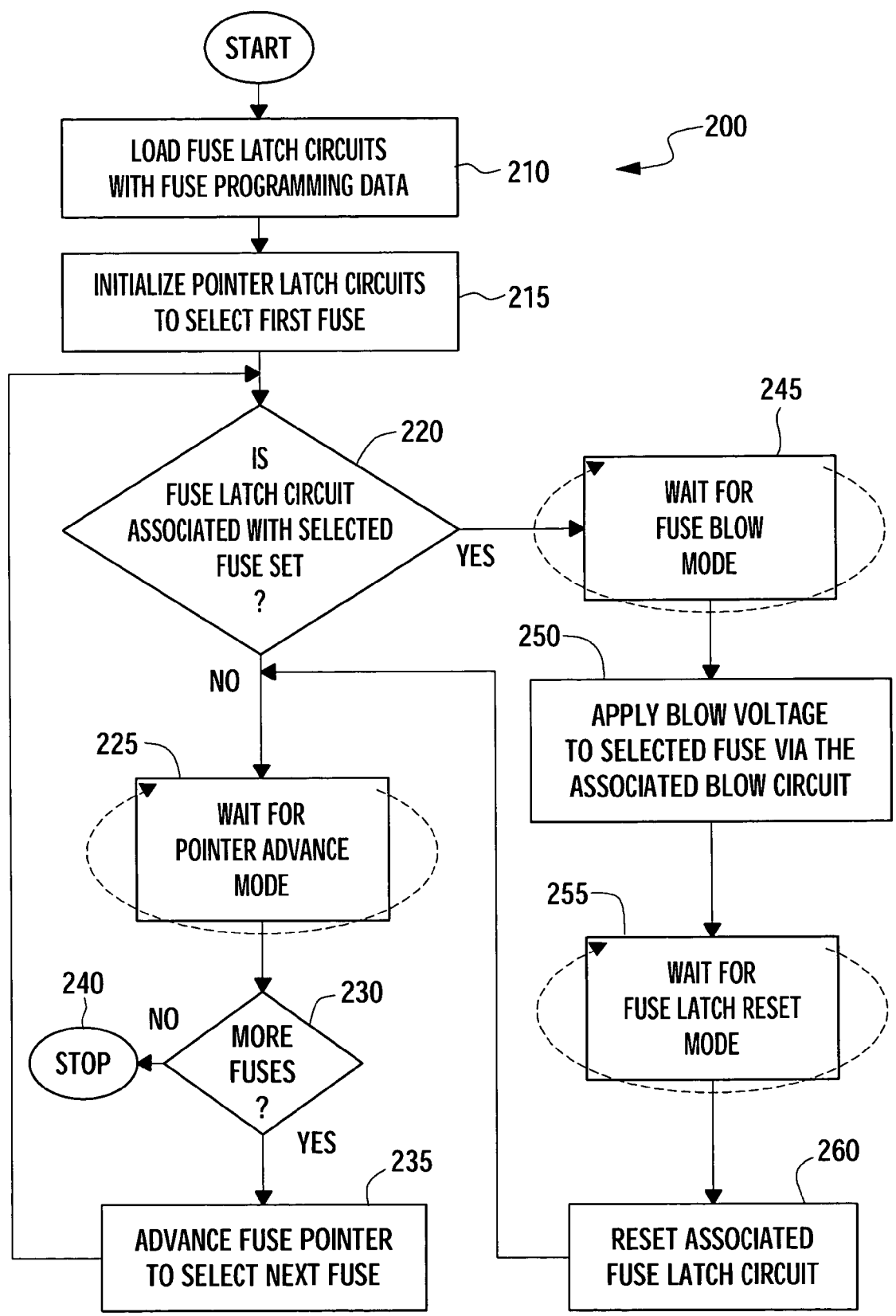
FIG. 2 illustrates a flowchart of a method for programming fuses according to one embodiment of the present invention.

FIG. 2 is a flowchart of a method 200 for programming fuses, according to one embodiment, that may be used to illustrate the fuse programming modes. The method 200 may be described with reference to FIG. 1. The method 200 starts at step 210, by loading the fuse latch circuits 130 with fuse programming data. For illustrative purposes, it will be arbitrarily assumed that a 1 in a fuse latch circuit indicates an associated fuse 150 is to be blown. As previously described, the fuse programming data may be loaded via the one or more serial fuse programming lines 108. At step 215, the pointer latch circuits 120 are loaded with a pointer value so that the fuse pointer selects the first fuse (e.g., fuse 150.1).

At step 220, a determination is made as to whether the fuse latch circuit 130 associated with the currently selected fuse 150 contains a 1. If not, (i.e., the currently selected fuse 150 is not to be programmed), operations flow to step 225 to wait for the pointer latch circuit 120 associated with the currently selected fuse 150 to enter the pointer advance mode. For example, there may be a delay between the pointer advance mode and the fuse blow mode, to ensure each fuse to be programmed is adequately exposed to a blow voltage during a blow sequence.

Once the pointer advance mode is entered, if there are more fuses at step 230, the fuse pointer advances and selects the next fuse (if any) at step 235. The operations may then return to step 220 to test the fuse latch circuit 120 associated with the currently selected fuse. The operations 220–235 may be repeated to asynchronously skip fuses 150 that are not to be blown, as indicated by the fuse latch circuits 120. Once the pointer is advanced to select a fuse 150 that is to be programmed, as determined at step 220, operation flow may continue to step 245 in order to blow the selected fuse 150.

At step 245, if the blow circuit is in blow mode, the selected fuse is blown at step 250. Otherwise, a wait loop may be entered at step 245 until the blow circuit enters the blow mode. Optionally, at step 255, if the fuse latch circuit 130 associated with the currently selected fuse 150 is in the fuse latch reset mode, the fuse latch circuit 130 is reset (e.g., loaded with a 0) at step 260. Resetting the fuse latch circuit 130 may ensure the selected fuse 150 is not programmed again and, as described below, may also ensure the fuse pointer may advance to select the next fuse. After resetting the fuse latch circuit 130 at step 260, the operations may return to step 225, to advance the fuse pointer. Finally, if there are no more fuses at step 230, the method 200 stops at step 240.

Figure 3:
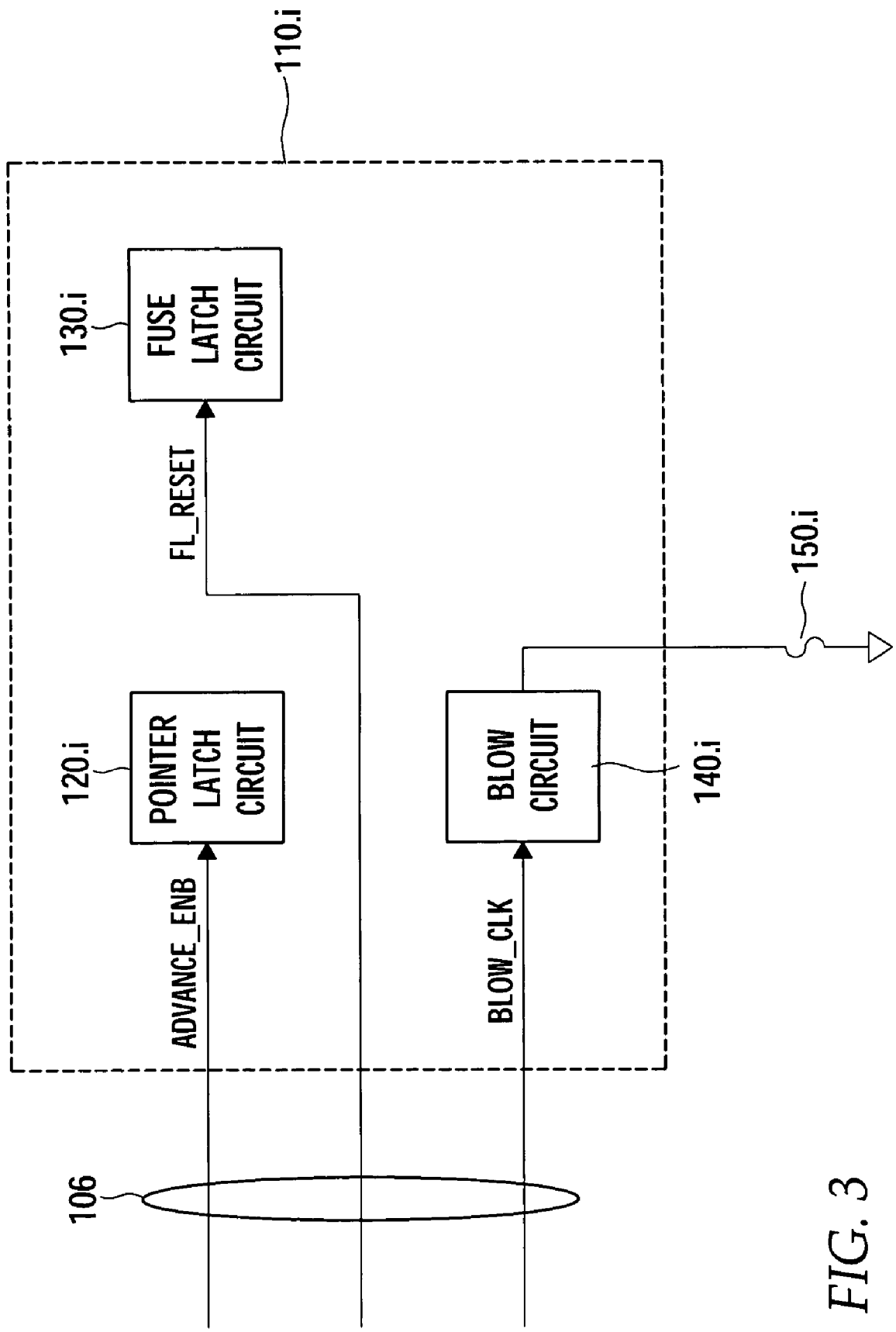
FIG. 3 illustrates one embodiment of the fuse programming circuit of FIG. 1 with control signals for fuse blowing, fuse latch resetting, and advancing the fuse pointer.

For some embodiments, the fuse blow mode, fuse latch reset mode and pointer advance mode may be defined by clock signals 106. For example, FIG. 3 illustrates one embodiment of a stage 110$i$ of the fuse programming circuit 102 of FIG. 1. As illustrated, a pointer latch circuit 120.i, fuse latch circuit 130.i, and blow circuit 140.i may each receive a clock signal (ADVANCE_ENABLE, FL_RESET, and BLOW_CLK, respectively). For simplicity, only one stage 110.i of the shift register 105 and the associated blow circuit 140.i and fuse 150.i are shown. In other words, referring back to FIG. 1, ADVANCE_ENABLE may be applied to all four pointer latch circuits 120, FL_RESET may be applied to all four fuse latch circuits 130, and BLOW_CLK may be applied to all four blow circuits 140. For some embodiments, a pointer latch circuit 120 is in the pointer advance mode if ADVANCE_ENABLE is high, and is not in the pointer advance mode if ADVANCE_ENABLE is low. A fuse latch circuit 130 is in the fuse latch reset mode if FL_RESET is high, and is not in the fuse latch reset mode if FL_RESET is low. A blow circuit 140 is in the blow mode if BLOW_CLK is high, and is not in the blow mode if BLOW_CLK is low.

Figure 4A:
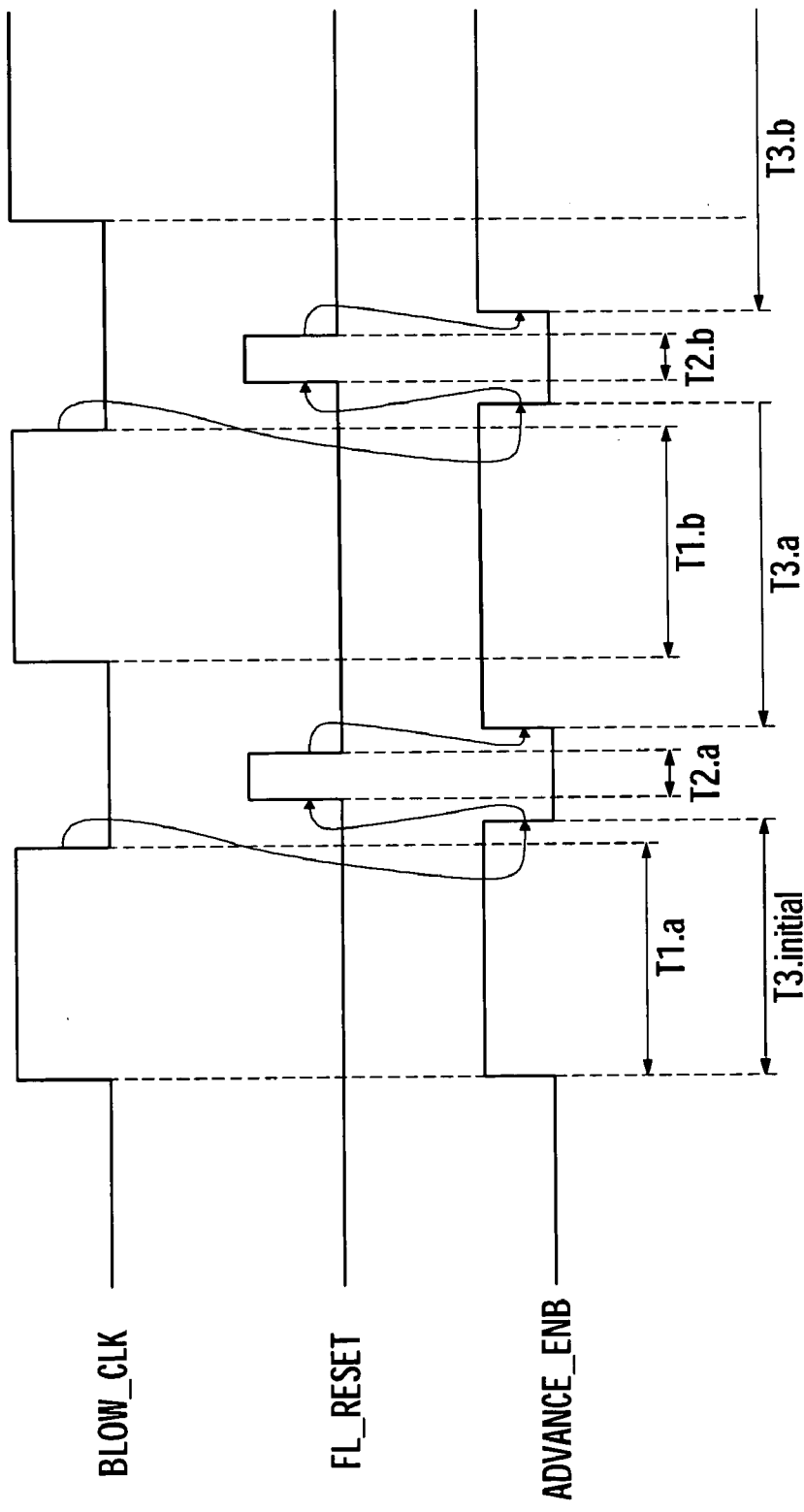
FIGS. 4A and 4B illustrate exemplary timing diagrams of the control signals of FIG. 3 according to embodiments of the present invention.

FIG. 4A illustrates a timing diagram of clock signals BLOW_CLK, FL_RESET, and ADVANCE_ENABLE of FIG. 3 according to one embodiment of the present invention. As shown, the four blow circuits 140 are in the blow mode during times T1.a and T1.b (called blow mode time T1). The four fuse latch circuits 130 are in the fuse latch reset mode during times T2.a and T2.b (called fuse latch reset mode time T2). The four pointer latch circuits 120 are in the pointer advance mode during times T3.initial, T3.a, and T3.b (called pointer advance mode time T3). For an example showing how the signals BLOW_CLK, FL_RESET, and ADVANCE_ENABLE of FIG. 4A may control the operation of the fuse programming circuit stage 110.i of FIG. 3, assume after steps 210 and 215 of method 200 that the fuse latch circuits 130 contain 0010b (i.e., only the fuse 150.3 is to be blown).

(i=1) The fuse 150.1 is initially selected by the fuse pointer (as a result of step 215). Initially, BLOW_CLK goes high, signaling the first blow time T1.a and ANDVANCE_ENB goes high, signaling the first pointer advance time T3.initial. At step 220, because the fuse latch circuit 130.1 associated with the currently selected fuse 150.1 contains a 0, and because the associated pointer latch circuit 120.1 is in pointer advance mode (and there are more fuses), the pointer is advanced to select the next fuse (150.2), at step 235, and operations return to step 220.

(i=2) At step 220, because the fuse latch circuit 130.2 associated with the currently selected fuse 150.2 also contains a 0, and the ADVANCE_ENB is still high at step 225, the pointer is again advanced to select the next fuse (150.3), at step 235, and operations again return to step 220. Again, the advancement of the fuse pointer from fuse 150.2 to fuse 150.3 is asynchronous because it occurs independently from any rising or falling edge of the control signals BLOW_CLK, FL_RESET, and ADVANCE_ENABLE. As a result, multiple fuses (e.g., fuses 150.1 and 150.2) may be skipped between successive blow modes, effectively reducing or eliminating empty programming cycles.

(i=3) At step 220, because the fuse latch circuit 130.3 associated with the currently selected fuse 150.3 contains a 1, operations flow to step 245. Assuming the present time is still in T1.a, the blow circuit 140.3 associated with the currently selected fuse 150.3 is in blow mode and, therefore, the selected fuse 150.3 is blown via the associated blow circuit 140.3, at step 250. In other words, the blow circuit 140.3 applies Vblow across fuse 150.3 during the remaining time of T1.a. Because the time it takes the fuse pointer to advance from the first fuse 150.1 to the next fuse to be blown 150.3 is short (dependent on transistor gate times, as will be described below) compared with any blow mode time T1, it can be assumed that applying Vblow across the fuse 150.3 during only the remaining time of T1.a is still sufficient.

After blowing the fuse 150.3, the associated fuse latch 130.3 may be optionally reset at step 260 after waiting for a fuse latch reset mode (e.g., the arrival of time T2.a), at step 255. As will be described in greater detail below, depending on the implementation, resetting (e.g., loading a 0) the fuse latch circuit 130.3 may ensure the fuse 150.3 is not subjected to another blow sequence and that the pointer is advanced to the next fuse. After optionally resetting the fuse latch circuit 130.3 at step 260, operations may return to step 225, to wait until ADVANCE_ENB goes high, signaling the next pointer advance mode (T3.a). Once ADVANCE_ENB goes high, the fuse pointer is advanced to select the next fuse (150.4), at step 235, and the operations return to step 220.

(I=4) At step 220, because the fuse latch circuit 130.2 associated with the currently selected fuse 150.2 contains a 0, and the ADVANCE_ENB is still high at step 225, operations advance to step 230. Because (in this example) there are no more fuses, the operations cease at step 240.

Figure 4B:
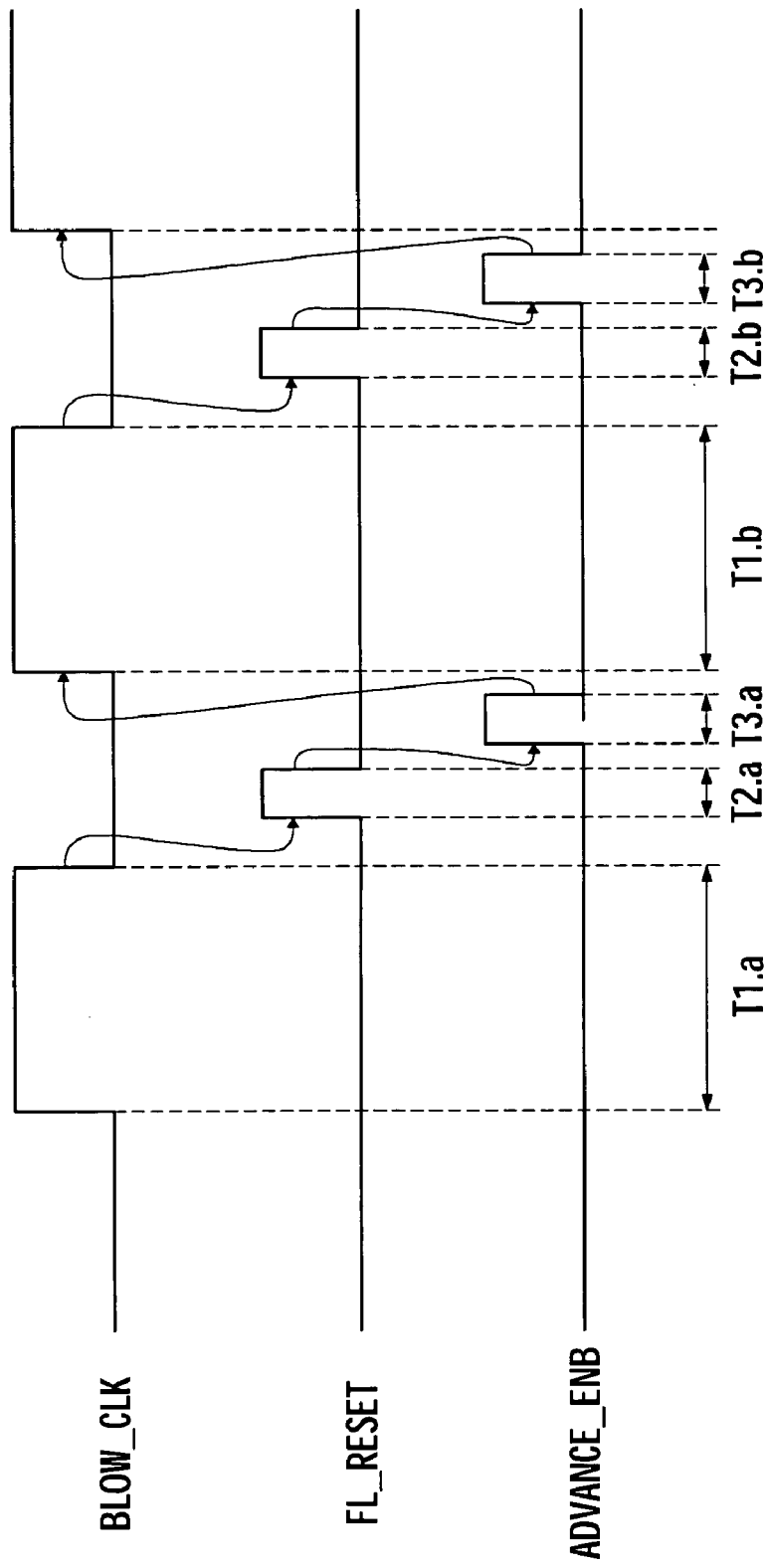

FIG. 4B illustrates another timing diagram of control signals BLOW_CLK, FL_RESET, and ADVANCE_ENABLE of FIG. 3 according to an alternative embodiment of the present invention. As shown, the four blow circuits 140 are in the blow mode during times T1.a and T1.b. The four fuse latch circuits 120 are in the fuse latch reset mode during times T2.a and T2.b. The four pointer latch circuits 120 are in the pointer advance mode during times T3.a, and T3.b. The times T1s, T2s, and T3s occur in the order of T1, T2, T3, T1, T2, T3, and so on with no overlap between T1s, T2s, and T3s. The timing diagram of FIG. 4B can be described by example, again, assuming that, after steps 210 and 215, the fuse latch circuits 130 contain 0010b (i.e., only the fuse 150.3 is to be blown).

(i=1) The fuse 150.1 is initially selected by the fuse pointer (as a result of step 215). Initially, BLOW_CLK goes high, signaling the first blow time T1.a, as in the previous example. However, at this point, ANDVANCE_ENB is low indicating the pointer latch circuit 130.1 associated with the selected fuse 150.1 is not in advance pointer mode. Accordingly, the wait loop of step 225 is entered. Once ADVANCE_ENB goes high, signaling the first advance pointer mode (T3.a), the fuse pointer is advanced to select the next fuse 150.2, at step 235, and operations continue at step 220.

(i=2) At step 220, because the fuse latch circuit 130.2 associated with the currently selected fuse 150.2 again contains a 0, and the ADVANCE_ENB is still high at step 225, the pointer is again advanced to select the next fuse (150.3), at step 235, and operations again return to step 220.

(i=3) At step 220, because the fuse latch circuit 130.3 associated with the currently selected fuse 150.3 is a 1, operations flow to step 245. In this example, however, rather than reaching step 245 sometime after the beginning of a blow mode, as in the previous example, BLOW_CLK is still low and, therefore, the wait loop of step 245 is entered. Accordingly, once BLOW_CLK goes high, the selected fuse 150.3 is blown, at step 250, for the duration of the blow time T1.b. In other words, an advantage to the timing diagram of FIG. 4B may be that a selected fuse 150.i may be exposed for an entire blow time, rather than a remaining blow time after pointer advancement. After blowing the selected fuse 150.3, operations continue as described in the previous example (e.g., after waiting for FL_RESET to go high at step 255, the fuse latch circuit 130.3 may be reset at step 260, and the operations may return to step 225.

Of course, any other suitable timing configurations may also be used. Regardless of the specific timing configuration, however, as described above, a selected fuse 150.i to be blown may synchronously blown for each blow mode time T1 (i.e., for each cycle of BLOW_CLK), while between blow mode times T1 the fuse pointer may be asynchronously advanced past fuses 150 not to be blown to select the next fuse 150 to be blown.

An Exemplary Schematic Diagram

Figure 5:
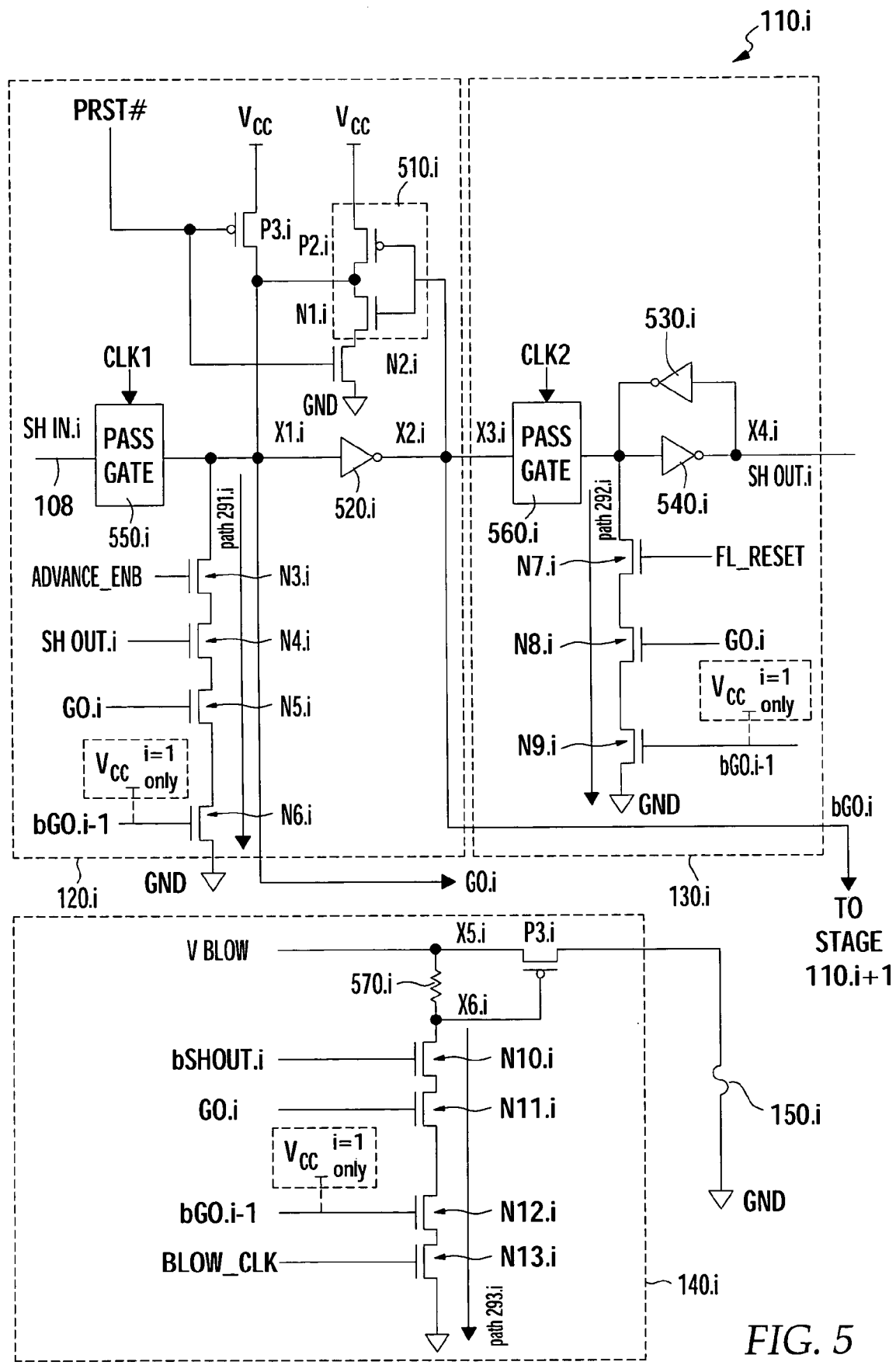
FIG. 5 is a schematic diagram of one stage of the fuse programming circuit of FIG. 3 according to one embodiment of the present invention.

FIG. 5 illustrates a schematic diagram of one stage 110.i of a fuse programming circuit 102, according to one embodiment of the present invention. As illustrated in FIG. 5, the stage 110.i may include a pointer latch circuit 120.i, fuse latch circuit 130.i, and a blow circuit 140.i configured to blow a fuse 150.i. Of course, it will be appreciated that the circuit illustrated in FIG. 5 is exemplary of just one embodiment of a fuse programming circuit stage 110.i and that any suitable circuitry may be used to implement the fuse programming circuit 102 to allow for synchronous fuse blowing and asynchronous fuse pointer advancement.

The pointer latch circuit 120.i (i=1, 2, 3, or 4) comprises, illustratively, transistors N1.i–N6.i, P1.i, P2.i (prefix P indicates PMOS [p-channel Metal Oxide Semiconductor] transistor, and prefix N indicates NMOS [n-channel MOS] transistor), a pass gate 550.i, and an inverter 520.i. The transistors N1.i and P2.i form an inverter 510.i. The two cross-coupled inverters 510.i and 520.i form a pointer latch 510.i,520.i. The logic level (1 for high and 0 for low) of node X1.i of the pointer latch 510.i,520.i represents the content of the pointer latch circuit 120.i.

In order to initialize the pointer latch circuits 120 (e.g., as in step 515 of FIG. 2), the node X1.i of the pointer latch 510.i,520.i may be coupled to Vcc via the pull-up transistor P1.i whose one gate receives a pointer reset signal PRST#. The reset transistor N2.i couples the two transistors N1.i and P2.i of the inverter 510.i to ground GND. A gate of the reset transistor N2.i receives the pointer reset signal PRST#. A pulse of PRST# (i.e., low for a short period of time) will load a 1b into the pointer latch circuit 120.i.

Node X1.i is also coupled to ground GND via a pointer latch reset path 591.i comprising the transistors N3.i, N4.i, N5.i, and N6.i in series. In other words, when all of the transistors N3–N6.i are turned on, the node X1.i is pulled to ground. A gate of transistor N3.i receives a control signal ADVANCE_ENABLE which, as previously described, may control the advancing of the fuse pointer along the fuses 150.

A gate of transistor N4.i receives a shift output signal SHout.i which is an output signal of the associated fuse latch circuit 130.i. A gate of the transistor N5.i is coupled to node X1.i so as to receive a signal GO.i from node X1.i.

A gate of the transistor N6.i receives a signal bGO.i−1 which is the inverse of the signal GO.i−1 from the preceding pointer latch circuit 120.i−1. In one embodiment, the gate of the transistor N6.i can be connected to a node X2.i−1 of the preceding pointer latch circuit 120.i−1. For i=1, the gate of the transistor N6.1 is tied to Vcc. In one embodiment, for i=2–4, the switching of bGO.i−1 from low to high during the programming of the fuses 150 indicates that the fuse pointer has advanced to the fuse 150.i. In fact, a fuse 150.i may be considered as being selected by the fuse pointer if the signals GO.i and bGO.i−1 (which are applied to the transistors N5.i and N6.i, respectively) are both high.

As illustrated, the signals GO.i and bGO.i−1 are also used to control the fuse latch circuit 130.i and blow circuit 140.i (along with FL_RESET and BLOW_CLK clock signals, respectively). As illustrated in FIG. 5, because the first stage 110.1 of the fuse programming circuit 102 may not have a preceding stage, the transistors of the first stage 110.1 that would normally be connected to bGO.i−1 (i.e., N6.1, N9.1, and N12.1) may be connected to VCC, effectively forcing bGO.i−1 to 1. Accordingly, when the first fuse latch circuit 130.1 is initialized with a 1, GO.1 will be set to 1, and the fuse 150.1 will be selected. In other words, because the fuse latch circuits are initialized to 1, the remaining bGO.i signals will be zero so the remaining fuses 150.i are not selected.

Node X1.i also receives, via the pass gate 550.i, a shift input signal SHin.i which is the output signal SHout.i−1 from node X4.i−1 of the preceding fuse latch circuit 130.i−1. The pass gate 550i is controlled (opened or closed) by a clock signal CLK1. For i=1, signal SHIN.1 conveys the fuse programming data into the fuse latch circuits 130.

The fuse latch circuit 130.i (i=1, 2, 3, or 4) comprises, illustratively, transistors N7.i, N8.i, N9.i, inverters 530.i and 540.i, and a pass gate 560.i. The cross-coupled inverters 530.i and 540.i form a fuse latch 530.i,540.i that stores the fuse programming data bit for the fuse latch circuit 130.i. The logic level of node X3.i of the fuse latch 530.i,540.i represents the content of the fuse latch circuit 130.i.

Node X3.i is coupled to node X2.i of the associated pointer latch circuit 120.i via the pass gate 560.i. The pass gate 560.i is controlled (opened or closed) by a clock signal CLK2. The node X3.i is also coupled to ground via a fuse latch reset path 592.i comprising the transistors N7.i, N8.i, and N9.i in series. A gate of transistor N7.i receives a fuse latch reset control signal FL_RESET which controls the loading of the fuse latch circuit 130.i with a 0b so that the associated fuse 150.i which was previously blown will not be blown again later. A gate of transistor N8.i receives the signal GO.i from the associated pointer latch circuit 120.i. A gate of transistor N9.i receives the signal bGO.i−1 from the preceding pointer latch circuit 120.i−1. As previously described, if i=1, the gate of transistor N9.i may tied to Vcc.

The blow circuit 140.i (i=1, 2, 3, or 4) comprises, illustratively, transistors P3.i, N10.i, N11.i, N12.i, N13.i, and a resistor 570.i. Node X5.i of the blow circuit 140.i is coupled to ground via the transistor P3.i and the fuse 150.i. A gate of the transistor P3.i is coupled to node X6.i. Node X6.i is coupled to node X5.i via the resistor 570.i. Node X6.i is also coupled to ground via a fuse blow enable path 593.i comprising the transistors N10.i, N11.i, N12.i, and N13.i in series.

A gate of transistor N10.i receives a signal bSHout.i which is the inverse of the signal SHout.i from the associated fuse latch circuit 130.i. A gate of transistor N11.i receives the signal GO.i from the associated pointer latch circuit 120.i. A gate of transistor N12.i receives the signal bGO.i−1 from the preceding pointer latch circuit 120.i−1. If i=1, the gate of transistor N12.1 is tied to Vcc. A gate of transistor N13.i receives the blow clock signal BLOW_CLK which controls the blowing of the fuses 150.i, as previously described. A blow voltage Vblow is applied to the node X5.i.

As previously described, a fuse 150.i can be considered as being selected by the fuse pointer if the signals GO.i and bGO.i−1 (which are applied to the transistors N5.i and N6.i, respectively) are both high. As a result, when all four pointer latch circuits 120 are initially loaded with all 1s, only fuse 150.1 is selected because GO.1 and bGO.0 are both high. The other fuses have their respective GO signal being low, therefore not selected. As a result, if a fuse 150.i is selected by the fuse pointer, if the fuse latch circuit 130.i contains a 0, and if ADVANCE_ENABLE is high (i.e., the pointer latch circuit 120.i is in the pointer advance mode), the pointer latch reset path 591.i opens loading a 0 into the pointer latch circuit 120.i. As a result, GO.i goes low meaning the fuse 150.i is no longer selected by the fuse pointer. The pointer latch circuit 120.i being loaded with a 0 also causes bGO.i to switch from low to high. bGO.i switching from low to high and GO.i+1 being high mean the fuse 150.i+1 becomes selected. In other words, the fuse pointer advances from fuse 150.i to the next fuse 150.i+1.

For the fuse latch reset circuit 130.i, it can be seen that if the fuse 150.i is selected (i.e., GO.i and bGO.i−1 are both high) and if the fuse latch reset circuit 130.i is in the fuse latch reset mode (i.e., FL_RESET is high), the fuse latch reset path 592.i opens loading a 0 into the fuse latch reset circuit. For the blow circuit 140.i, it can be seen that if the fuse 150.i is selected (i.e., GO.i and bGO.i−1 are both high), if the fuse latch circuit 130.i contains a 1 (causing SHout.i to be high), and if the blow circuit 140.i is in blow mode (i.e., BLOW_CLK is high), the fuse blow enable path 593.i opens. As a result, blow transistor P3.i opens and Vblow is applied across fuse 150.i so as to blow the fuse 150.i.

As previously described, the programming of the fuses 150.1, 150.2, 150.3, and 150.4 is initialized (step 210 of FIG. 2) with the fuse latch circuits 130.1, 130.2, 130.3, and 130.4 being loaded with fuse programming data (0010b if only the fuse 150.3 is to be blown). More specifically, fuse programming data 0010b can be shifted into the fuse latch circuits 130.1, 130.2, 130.3, and 130.4 one bit at a time as the signal SHin.1. Clock signals CLK1 and CLK2 are used to control the shifting of each bit of fuse programming data 0010b into the fuse latch circuits 130.1, 130.2, 130.3, and 130.4.

During this shifting process, BLOW_CLK, FL_RESET, and ADVANCE_ENABLE may be kept low. ADVANCE_ENABLE being low turns off the transistors N3.i (i=1–4) shutting off the pointer latch reset paths 591.i (i=1–4). FL_RESET being low turns off the transistors N7.i (i=1–4) shutting off the fuse latch reset paths 592.i (i=1–4). BLOW_CLK being low turns off the transistors N13.i (i=1–4) shutting off the fuse blow enable paths 593.i (i=1–4). This turns off the blow transistors P3.i (i=1–4) preventing the blowing of any fuses 150 while BLOW_CLK is low.

After the fuse latch circuits 130.1, 130.2, 130.3, and 130.4 are loaded with fuse programming data (e.g., 0010b in the previous examples), the pass gates 550.i and 560.i (i=1–4) are closed so as to isolate each of the pointer latch circuits 120 and the fuse latch circuits 130. Then the pointer reset signal PRST# is pulsed (pulled low for a short period of time) to reset (load with 1b) the four pointer latch circuits 120 (step 215 of FIG. 2). As a result, the fuse pointer points to the first fuse 150.1. Then, the programming of the fuses 150 can be performed as described above.

Figure 6:
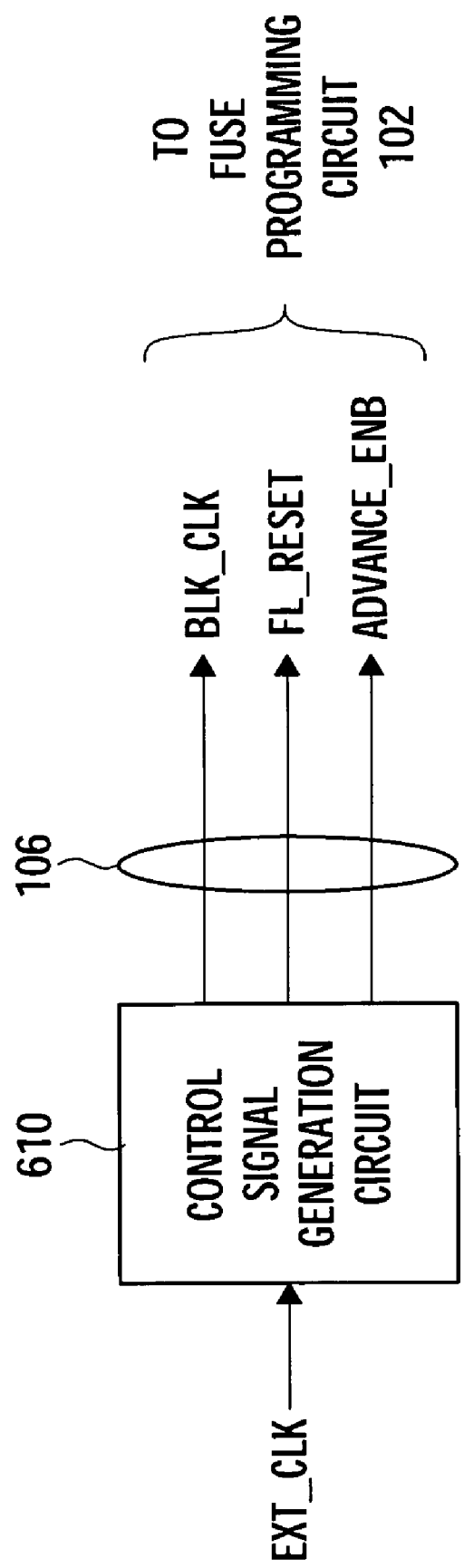
FIG. 6 is one embodiment of a control signal generation circuit for generating the control signals of FIG. 3.

FIG. 6 is one embodiment of a control signal generation circuit 610 for generating the control signals 106 (BLOW_CLK, FL_RESET, and ADVANCE_ENABLE) of FIG. 3 from a single external clock signal EXT_CLK. An advantage to generating the control signals 106 from a single external clock signal is that the blow voltage time (e.g., when BLOW_CLK is high) may be easily varied, for example, to accommodate changes in blow voltage and/or changes in fuses 150 that may require more or less exposure time to the blow voltage to ensure the fuses 150 are blown. The control signal generation circuit 610 may be external to the fuse programming circuit 102 as shown in FIG. 6. In an alternative embodiment, the control signal generation circuit 610 can be a part of the fuse programming circuit 102.

The control signal generation circuit 610 receives EXT_CLK and generates the control signals BLOW_CLK, FL_RESET, and ADVANCE_ENABLE. The signal generation circuit may configured to generate the signals according to the timing diagrams of FIG. 4A, FIG. 4B, or any other suitable timing diagram. In general, the circuit 610 may be configured to generate BLOW_CLK, FL_RESET, and ADVANCE_ENABLE such that, after each blow mode time T1, there is a fuse latch reset mode time T2 so that the fuse pointer can advance past the fuse that has just been blown in the fuse blow mode time T1. Moreover, for some embodiments, the circuit 610 may be configured to generate BLOW_CLK, FL_RESET, and ADVANCE_ENABLE such that there is no overlap between a fuse latch reset mode time T2 and a pointer advance mode time T3. If there is an overlap between a T2 and a T3, during the overlap, the fuse pointer may advance past (i.e., without stopping at) a fuse that is to be blown. This is because, for some embodiments, when the fuse pointer reaches (i.e., selects) the fuse to be blown, the fuse latch circuit associated with the fuse is loaded with a 0. As a result, the fuse pointer automatically and asynchronously advances to the next fuse. As a result, the fuse to be blown will not be blown at all.

In summary, a new concept and implementation for controlling the programming of electrical fuses 150 is presented. The fuse programming circuit 102 may utilize an external clock to control the time (T1) during which each fuse 150 that is to be blown is in turn subjected to blow voltage Vblow. In other words, the fuses 150 that are to be blown are synchronously and sequentially blown. This fuse programming circuit 102 also employs a fuse pointer that automatically and asynchronously (i.e., independently from any external control signals like EXT_CLK) skips fuses that are not to be blown. This results in a significant reduction in the time needed to program the fuses 150, while maintaining the flexibility to easily control the time (T1) each fuse 150 is subjected to a blow voltage (Vblow) through the externally clock signal (EXT_CLK).

Controlling the blow voltage time with the external clock signal (EXT_CLK) may also eliminate the need for individual delay circuits for each stage, which may further reduce the size of each fuse programming stage. Further, using a dual-purpose shift-register 105 (FIG. 1) for storing both the fuse pointer value (using the pointer latch circuits 120) and the fuse programming data (using the fuse latch circuits 130) may result in further size reductions. Of course, while the embodiments In the embodiments above, the fuse programming circuit 102 has four stages 110.1–110.4. In general, of course, a circuit may have any number N of fuses and, therefore, a corresponding fuse programming circuit may include any number N of stages 110.1–110.N.

While the foregoing is directed to embodiments of the present invention, other and further embodiments of the invention may be devised without departing from the basic scope thereof, and the scope thereof is determined by the claims that follow.

What is claimed is:

1. A fuse programming circuit for sequentially programming a plurality of fuses comprising:
   a plurality of fuse latch circuits for holding fuse programming data indicating which of the fuses are to be blown;
   a fuse pointer circuit for selecting fuses configured to asynchronously advance past fuses that are not to be programmed to select fuses that are to be programmed, as indicated by the fuse programming data; and
   a blow circuit configured to apply a blow voltage to a fuse selected by the fuse pointer circuit if the fuse programming data indicates the selected fuse is to be blown, wherein the application of the blow voltage to the fuse is synchronized with a blow clock signal.

2. The fuse programming circuit of claim 1, wherein the fuse pointer circuit is configured to asynchronously advance during a pointer advance mode defined by a pointer advance clock signal.

3. The fuse programming circuit of claim 2, wherein the fuse pointer circuit comprises a plurality of fuse pointer latches, each associated with one of the plurality of fuses.

4. The fuse programming circuit of claim 3, wherein the fuse pointer circuit is configured to select a fuse when the fuse pointer latch associated with the fuse contains a first value and the fuse pointer latch associated with a previously selected fuse contains a second complementary value.

5. The fuse programming circuit of claim 2, wherein the fuse programming circuit further comprises a control signal generating circuit configured to receive an external clock signal and generate the blow clock signal and pointer advance clock signal based on the external clock signal.

6. The fuse programming circuit of claim 5, wherein the blow clock signal and pointer advance clock signal are non-overlapping.

7. The fuse programming circuit of claim 1, wherein each of the plurality of fuse latch circuits holds a bit of fuse programming data for an associated one of the plurality of fuses.

8. The fuse programming circuit of claim 7, wherein the blow circuit is configured to apply the blow voltage to the fuse selected by the fuse pointer circuit if the bit of fuse programming data in the associated fuse latch circuit indicates the selected fuse is to be blown.

9. The fuse programming circuit of claim 8, wherein the associated fuse latch circuit is configured to change the bit of fuse programming data after the associated fuse is blown.

10. The fuse programming circuit of claim 2, wherein the associated fuse latch is configured to change the bit of the fuse programming data after the associated fuse is blown during a fuse latch reset mode defined by a fuse latch reset clock signal.

11. The fuse programming circuit of claim 10, wherein the fuse programming circuit further comprises a control signal generating circuit configured to receive an external clock signal and generate the blow clock signal, pointer advance clock signal, and fuse latch reset clock signal based on the external clock signal.

12. A DRAM comprising:
a plurality of fuses;
a plurality of fuse latch circuits for holding fuse programming data;
a fuse pointer circuit for selecting fuses, the fuse pointer circuit configured to asynchronously advance past fuses that are not to be programmed to select fuses that are to be programmed, as indicated by the fuse programming data; and
a blow circuit configured to apply a blow voltage to a fuse selected by the fuse pointer circuit if the fuse programming data indicates the selected fuse is to be blown, wherein the application of the blow voltage to the fuse is synchronized with a blow clock signal.

13. The DRAM of claim 12, wherein the fuse pointer circuit is configured to asynchronously advance during a pointer advance mode defined by a pointer advance clock signal.

14. The DRAM of claim 13, wherein the fuse pointer circuit comprises a plurality of fuse pointer latches, each associated with one of the plurality of fuses.

15. The DRAM of claim 14, wherein the fuse pointer circuit is configured to select a fuse when the fuse pointer latch associated with the fuse contains a first value and the fuse pointer latch associated with a previously selected fuse contains a second complementary value.

16. The DRAM of claim 13, wherein the fuse programming circuit further comprises a control signal generating circuit configured to receive an external clock signal and generate the blow clock signal and pointer advance clock signal based on the external clock signal.

17. The DRAM of claim 16, wherein the blow clock signal and pointer advance clock signal are non-overlapping.

18. The DRAM of claim 12, wherein each of the plurality of fuse latch circuits holds a bit of fuse programming data for an associated one of the plurality of fuses.

19. The DRAM of claim 18, wherein each of the associated fuse latch circuits is configured to change the bit of fuse programming data after the associated fuse is blown.

20. A method for sequentially programming a plurality of fuses, comprising:
loading a plurality of fuse latch circuits with fuse programming data;
initializing a fuse pointer to select a first fuse;
providing a fuse blowing clock signal;
advancing the fuse pointer to select a second fuse to be blown, as indicated by the fuse programming data, wherein the advancing is not synchronized with the fuse blowing clock signal; and
blowing the second fuse, wherein the blowing is synchronized with the fuse blowing clock signal.

21. The method of claim 20 wherein the second fuse is selected immediately after the first fuse.

22. The method of claim 21 wherein advancing the fuse pointer to select the second fuse comprises switching a first pointer latch circuit associated with the first fuse from a first state to a second state.

23. The method of claim 22 wherein switching the first pointer latch circuit from the first state to the second state comprises opening a first pointer latch reset path associated with the first pointer latch circuit if the first fuse is not to be blown, as indicated by the fuse programming data.

24. The method of claim 23 wherein opening the first pointer latch reset path comprises opening the first pointer latch reset path in response to the first fuse being selected and in response to a first fuse latch circuit associated with the first fuse containing a bit of fuse programming data indicating that the first fuse is not to be blown.

25. The method of claim 24 further comprising switching a second fuse latch circuit associated with the second fuse and selecting a third fuse being next to the second fuse in response to switching the second fuse latch circuit.

26. The method of claim 25 wherein selecting the third fuse in response to switching the second fuse latch circuit comprises:
switching a second pointer latch circuit associated with the second fuse; and
selecting the third fuse in response to switching the second pointer latch circuit.

27. The method of claim 26 wherein switching the second pointer latch circuit comprises opening a second pointer latch reset path associated with the second pointer latch circuit in response to switching the second fuse latch circuit.

28. The method of claim 20 wherein blowing the second fuse, wherein the blowing is synchronized with the fuse blowing clock signal, comprises blowing the second fuse as long as the fuse blowing clock signal is asserted, wherein the fuse blowing clock signal is asserted before the second fuse is selected and de-asserted after the second fuse is selected.

29. The method of claim 20 wherein advancing the fuse pointer comprises advancing the fuse pointer during an advance pointer mode defined by an advance pointer clock signal.

30. The method of claim 29, further comprising generating the fuse blowing clock signal and the advance pointer clock signal from an external clock signal.

31. A method for sequentially programming a plurality of fuses, comprising:
loading a plurality of fuse latch circuits with fuse programming data, wherein each fuse latch circuit holds a bit of fuse programming data to indicate whether an associated one of the fuses is to be blown;
initializing a fuse pointer to select a first one of the fuses;
generating a fuse blow clock signal, a fuse latch reset clock signal, and a pointer advance clock signal from an external clock signal;
asynchronously advancing the fuse pointer during a pointer advance mode defined by the pointer advance clock signal until a second fuse to be blown, as indicated by the bit of fuse programming data held in the fuse latch circuit associated with the second fuse, is selected;
blowing the second fuse, wherein the blowing is synchronized with the fuse blow clock signal; and
changing the bit of fuse programming data in the fuse latch circuit associated with the second fuse during a fuse latch reset mode defined by the fuse latch reset clock signal.

32. The method of claim 24, wherein the fuse blow clock signal, fuse latch reset clock signal, and pointer advance clock signal are non-overlapping.

33. The method of claim 25, wherein asynchronously advancing the fuse pointer during a pointer advance mode comprises skipping at least one fuse between the first and second fuses that is not to be programmed, as indicated by the bit of fuse programming data held in the fuse latch circuit associated with the skipped fuse.

34. The method of claim 24, wherein asynchronously advancing the fuse pointer comprises shifting a value through a shift register comprising a fuse pointer circuit for each of the plurality of fuses.

* * * * *